US008578303B1

(12) United States Patent
Tsai et al.

(10) Patent No.: US 8,578,303 B1
(45) Date of Patent: Nov. 5, 2013

(54) METHOD FOR COMPENSATING EFFECT OF PATTERNING PROCESS AND APPARATUS THEREOF

(75) Inventors: Kuen-Yu Tsai, Taipei (TW); Chooi-Wan Ng, Taipei (TW); Yi-Sheng Su, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/542,819

(22) Filed: Jul. 6, 2012

(51) Int. Cl.
*G06F 17/50* (2006.01)

(52) U.S. Cl.
USPC .................. 716/51; 716/50; 716/52; 716/53; 716/55

(58) Field of Classification Search
None
See application file for complete search history.

(56) References Cited

U.S. PATENT DOCUMENTS 7,260,812 B2 8/2007 Melvin, III et al.
7,318,214 B1 1/2008 Prasad et al.
7,487,490 B2 * 2/2009 Zhang et al. .................... 716/50
7,533,363 B2 * 5/2009 Zhang et al. .................... 716/55
8,336,003 B2 * 12/2012 Cheng et al. .................... 716/53
2005/0091632 A1 * 4/2005 Pierrat et al. .................... 716/20
2005/0223350 A1 * 10/2005 Zhang et al. .................... 716/21

OTHER PUBLICATIONS

Painter, et al., Classical Control Theory Applied to OPC Correction Segment Convergence, Proc. of SPIE, vol. 5377, 2004, pp. 1198-1206.

* cited by examiner

*Primary Examiner* — A. M. Thompson
(74) *Attorney, Agent, or Firm* — Rosenberg, Klein & Lee

(57) ABSTRACT

A method for compensating an effect of a patterning process is illustrated. The main concept of the method for compensating the effect of the patterning process is to add or subtract the correction amounts for all segments according to the set of the comparison values at the set of the evaluation points. Compared with the delta-chrome optical proximity correction method, the run time of the method for compensating the effect of the patterning process is reduced, the memory usage of the method for compensating the effect of the patterning process not increased, and the correction accuracy of the method for compensating the effect of the patterning process is not reduced.

20 Claims, 6 Drawing Sheets

START
S21 PROVIDING A SET OF CONTROL POINTS
S22 DEFINING A LAYOUT AS AN INPUT TO THE PATTERNING PROCESS
S23 PROVIDING A SET OF EVALUATION POINTS
S24 PROVIDING A SET OF TARGET MEASUREMENT VALUES OF THE EFFECT OF THE PATTERNING PROCESS AT THE SET OF THE EVALUATION POINTS
S25 PROVIDING A SET OF ACTUAL MEASUREMENT VALUES OF THE EFFECT OF THE PATTERNING PROCESS WITH THE LAYOUT AT THE SET OF EVALUATION POINTS
S26 COMPUTING A SET OF COMPARISON VALUES ACCORDING TO THE TARGET MEASUREMENT VALUES AND THE ACTUAL MEASUREMENT VALUES AT THE SET OF EVALUATION POINTS
S27 MOVING THE SET OF THE CONTROL POINTS TO A SET OF UPDATED LOCATIONS WITH A PLURALITY OF DIRECTIONS AND A PLURALITY OF AMOUNTS ACCORDING TO THE SET OF THE COMPARISON VALUES
S28 GENERATING AN UPDATED LAYOUT AS AN UPDATED INPUT TO THE PATTERNING PROCESS
END

START
S61 DENSE SIMULATION
S611 EVALUATING FULL FIELD SIGNALS
S612 CALCULATING THE SIGNAL ERROR VALUES
S613 CALCULATING THE EDGE PLACEMENT ERROR VALUES ACCORDING TO THE SINGAL ERROR VALUES
S62 DETERMINING WHETHER THE LAYOUT SHOULD BE CORRECTED ?
YES
S63 CALCULATING THE CORRECTION AMOUNTS AND DIRECTIONS FOR ALL SEGMENTS ACCORDING TO THE SET OF THE COMPARISON VALUES
S64 UPDATING THE LAYOUT
NO
END

| DCOPC METHOD | | | |
|---|---|---|---|
| LAYER | LTERATION NO. | RUN TIME(s) | MEMORY(GB) |
| POLY | 13 | 64 | 2.151 |
| ACTIVE | 9 | 45 | 2.127 |
| CONTACT | 6 | 30 | 2.112 |
| NON-DCOPC METHOD | | | |
| LAYER | LTERATION NO. | RUN TIME(s) | MEMORY(GB) |
| POLY | 10 | 48 | 2.151 |
| ACTIVE | 7 | 35 | 2.127 |
| CONTACT | 6 | 28 | 2.112 |

METHOD FOR COMPENSATING EFFECT OF PATTERNING PROCESS AND APPARATUS THEREOF

BACKGROUND

1. Technical Field

The present disclosure relates to a patterning process of semiconductor manufacturing, in particular, to a method for compensating the effect of a patterning process and an apparatus thereof, wherein the method for compensating the effect of the patterning process is a non-delta-chrome optical proximity correction (non-DCOPC) method in the patterning process of semiconductor manufacturing, and the patterning process represents a lithography process or an etching process.

2. Description of Related Art

Patterning is an important process in the semiconductor manufacturing. By using the patterning process, the semiconductor manufacturers optimize the layout on a photomask which is based on the drawn layout from the integrated circuit (IC) designers, and then use a light source projects the layout on the photomask to the wafer, thus forming the actual layout on the wafer. Without any patterning process effect, the actual layout on the wafer is ideally identical to the layout on the photomask.

Generally speaking, the minimum line width of the lithography is proportional to the wavelength of the light source. In other words, the less the line width is, the shorter the wavelength of the light source is adapted in the patterning process.

Referring to FIG. 1A, FIG. 1A is schematic diagram showing the actual layout on the wafer in the case that the layout of the photomask is not corrected by the optical proximity correction (OPC) method. After the light source passes the photomask, the actual layout 13 is formed on the wafer. Without any patterning process effect, the drawn layout 12 (also called desired layout) on the wafer is identical to the layout 11 on the photomask. However, due to the diffraction, the actual layout 13 on the wafer is not the same as layout 11 on the photomask.

To make the actual layout 13 on the wafer close to the drawn layout 12 on the wafer, an OPC method is proposed to correct the layout 11 on the photomask. Referring to FIG. 1B, FIG. 1B is a schematic diagram showing the actual layout on the wafer in the case that the layout on the photomask is corrected by the OPC method. The OPC method corrects the patterning process effect to generate the layout 11 on the photomask. After the light source passes the layout 11 on the photomask, the actual layout 13 is formed on the wafer, wherein the actual layout 13 is close to the drawn layout 12 on the wafer.

Since the IC design dimensions shrink to the deep sub-wavelength regime, some nonlinear patterning process effect, such as mask topographic effect, resist development effect, and etching proximity effect ignored by the conventional OPC method have become significant for accurate OPC. Currently, the delta-chrome OPC (DCOPC) method with the OPC process model has to take into account the previously ignored nonlinear patterning process effect.

The DCOPC method runs a dense simulation for calculating the edge placement error (EPE) values of all segments. If the EPE values are not satisfied, the computation of the mask perturbation response to predict the amount of the proper chrome change is performed using a sparse simulation on a segment-by-segment basis. The step for adjusting the chrome change of each segment is iteratively performed until the EPE value is satisfied. The total run time is proportional to the number of the iterations required. Accordingly, the DCOPC method is challenged owing to the large complexity of the computation of the mask perturbation response.

SUMMARY

An exemplary embodiment of the present disclosure provides a method for compensating an effect of a patterning process. The patterning process represents a lithography process or an etching process, and an iteration of the method for compensating the effect of the patterning process comprises the following steps. A set of control points is provided. A layout as an input to the patterning process is defined, wherein the layout is represented by a set of boundaries, and the boundaries pass through the control points and enclose a set of regions with a plurality of constant values for the patterning process. A set of evaluation points is provided. A set of target measurement values of the effect of the patterning process at the evaluation points is provided. A set of actual measurement values of the effect of the patterning process with the layout at the evaluation points is provided. A set of comparison values is computed according to the target measurement values and the actual measurement values at the set of the evaluation points. The set of the control points is moved to a set of updated locations with a plurality of directions and a plurality of amounts according to the set of the comparison values. An updated layout as an updated input to the patterning process is generated, wherein the updated layout is represented by a set of updated boundaries, and the updated boundaries pass through the control points with the updated locations.

An exemplary embodiment of the present disclosure provides an apparatus for compensating an effect of a patterning process, wherein the patterning process represents a lithography process or an etching process. The apparatus for compensating the effect of the patterning process comprises a dense simulator, a decision device, a calculating device, and a layout updating device. The dense simulator selectively receives a layout initially designed or updated by a layout updating device, runs a dense simulation with the layout as an input to the patterning process to obtain a set of target measurement values of the effect of the patterning process at a set of evaluation points and a set of actual measurement values of the effect of the patterning process with the layout at the evaluation points, and computes a set of comparison values at the set of the evaluation points according to the set of the actual measurement values and the set of the target measurement values, wherein the layout is represented by a set of boundaries, and the boundaries pass through a set of control points and enclose a set of regions with a plurality of constant values for the patterning process. The calculating device calculates a plurality of directions and a plurality of amounts according to the set of the comparison values, and moves the set of the control points to a set of updated locations with the directions and the amounts according to the set of the comparison values. The layout updating device generates an updated layout as an updated input to the patterning process, wherein the updated layout is represented by a set of updated boundaries, and the updated boundaries pass through the control points with the updated locations.

To sum up, a method and an apparatus for compensating an effect of a patterning process is illustrated. The main concept of the method and the apparatus for compensating the effect of the patterning process is to add or subtract the correction amounts for all segments according to the set of the comparison values at the set of the evaluation points.

In order to further understand the techniques, means and effects the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
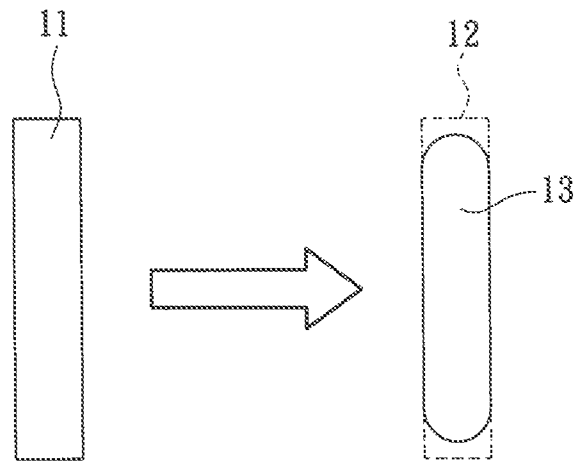
FIG. 1A is schematic diagram showing the actual layout on the wafer in the case that the layout of the photomask is not corrected by the OPC method.
Figure 1B:
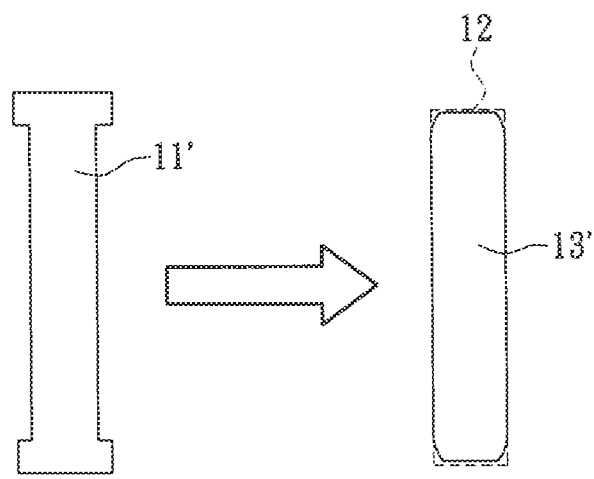
FIG. 1B is a schematic diagram showing the actual layout on the wafer in the case that the layout on the photomask is corrected by the OPC method.

Reference will now be made in detail to the exemplary embodiments of the present disclosure, examples of which are illustrated in the accompanying drawings. Wherever possible, the same reference numbers are used in the drawings and the description to refer to the same or like parts.

Exemplary embodiments of the present disclosure provide a method for compensating an effect of a patterning process and an apparatus thereof, wherein the method for compensating the effect of the patterning process is also called a non-delta-chrome optical proximity correction (non-DCOPC) method. The method for compensating the effect of the patterning process can be applied to particle beam lithography.

The main concept of the method for compensating the effect of the patterning process is to add or subtract the correction amounts for all segments according to the set of the comparison values at the set of the evaluation points. In other words, the set of control points of the layout being present of the overall segments is moved to a set of updated locations according to the comparison values once. The comparison values are obtained by the feedback technique, and the comparison value may be SE or EPE value at the evaluation point.

Figure 2:
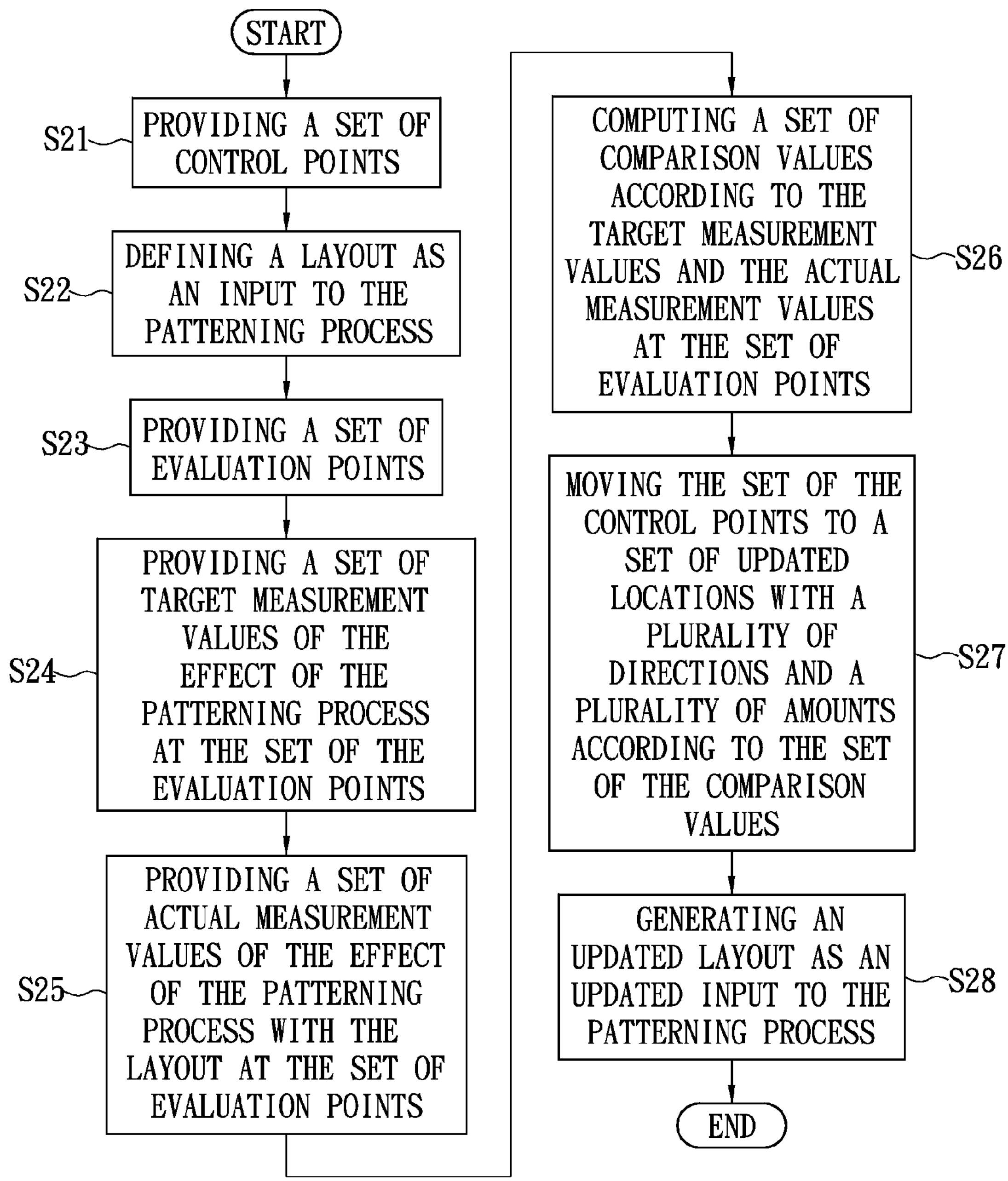
FIG. 2 is a flow chart showing an iteration of a method for compensating an effect of a patterning process according to an exemplary embodiment of the present disclosure.
Figure 3:
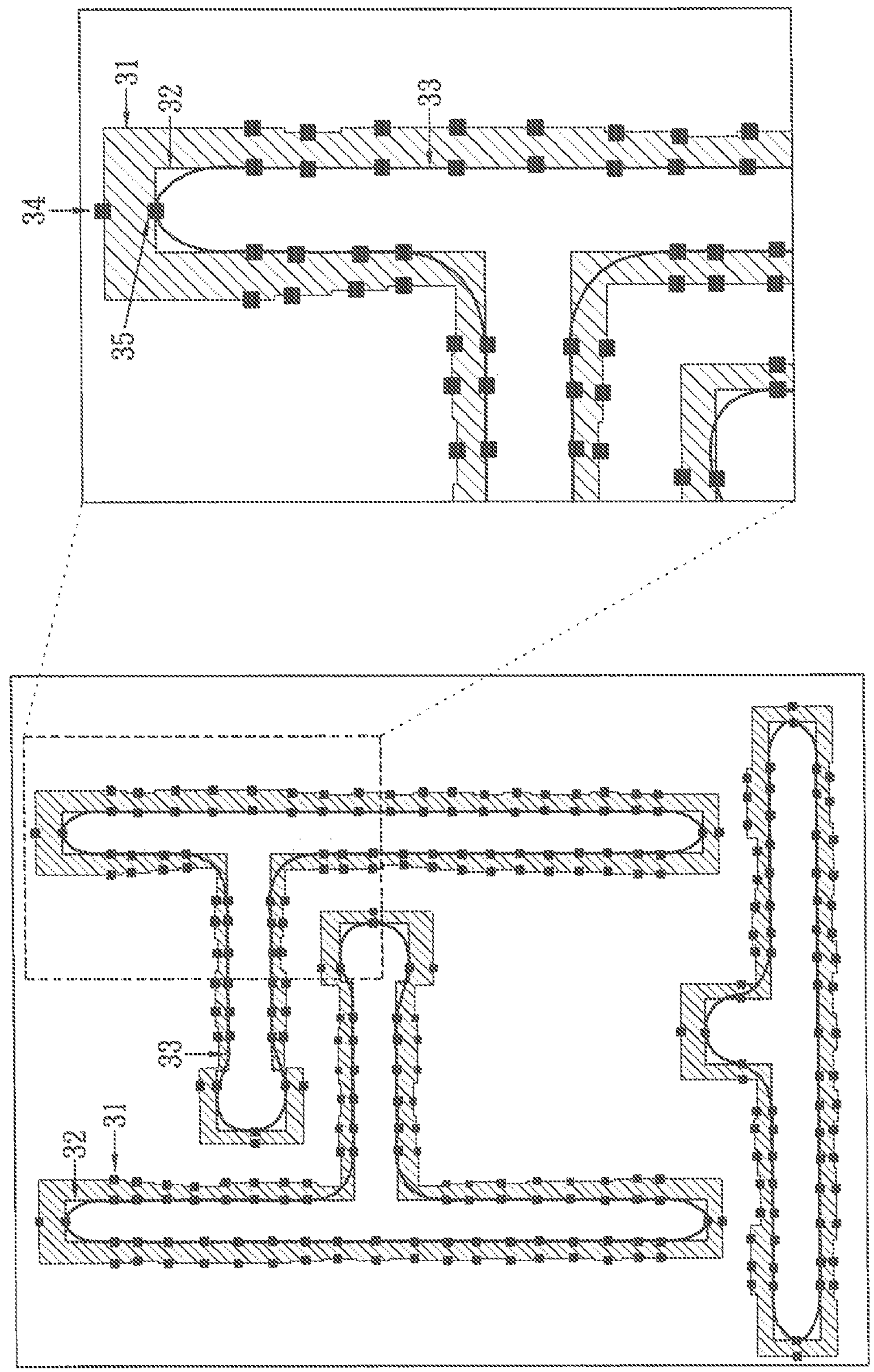
FIG. 3 is a planar diagram showing a layout as an input to the patterning process, a drawn layout, and an actual layout according to an exemplary embodiment of the present disclosure.

Referring to FIG. 2 and FIG. 3, FIG. 2 is a flow chart showing an iteration of a method for compensating an effect of a patterning process according to an exemplary embodiment of the present disclosure, and FIG. 3 is a planar diagram showing a layout as an input to the patterning process, a drawn layout, and an actual layout according to an exemplary embodiment of the present disclosure.

When the method for compensating the effect of the patterning process determines the layout as the input to the patterning process should be corrected, the iteration in FIG. 2 is executed. The condition that the layout should not be corrected may be that the iteration number exceeds a target iteration number, or that a set of comparison values falls within a set of target comparison values. In other words, the iteration may be halted according to the iteration number and the target iteration number, or according to the set of comparison values and the set of the target comparison values.

At step S21, a set of control points 34 is provided. At step S22, a layout 31 as an input to the patterning process is defined. The layout as the input to the patterning process shown in FIG. 3 comprises three segments is represented by a set of boundaries, and the set of the boundaries passes through the set of the control points 34 and encloses a set of regions with a plurality of constant values for the patterning process. The set of boundaries is present of the layout 31 on the photomask which is defined as an input to the patterning process.

At step S23, a set of evaluation points 35 is provided. The set of the evaluation points 35 is represented by a set of drawn boundaries, and the set of the drawn boundaries passes through the evaluation points 34 and encloses a set of drawn regions. The set of the drawn boundaries is present of the drawn layout 32 on the wafer which is desired by the designer.

At step S24, a set of target measurement values of the effect of the patterning process at the set of the evaluation points 35 is provided. At step S25, a set of actual measurement values of the effect of the patterning process with the layout 31 at the set the evaluation points 35 is provided.

With the layout 31 as the input to the patterning process, the actual layout 33 on the wafer is formed. Due to the patterning process effect the actual layout 33 on the wafer may not be the same as the drawn layout 32 and the layout 31 as the input to the patterning process. Therefore, at step S26, a set of comparison values is computed according to the target measurement values and the actual measurement values at the set of the evaluation points. The set of the comparison values is used to evaluate the similarity between the actual layout 33 and the drawn layout 32.

The type of the actual measurement values is the same as the type of the target measurement values. For example, when the actual measurement values are the actual signal values, the target measurement values are signal threshold values. The comparison value is the SE value at the evaluation point 35, for example. However, the type of the comparison values is not used to limit the present disclosure, and the comparison values may be the EPE values in the other exemplary embodiment.

At step S27, the set of the control points 34 is moved to a set of updated locations with a plurality of directions and a plurality of amounts according to the set of the comparison values. At step S28, an updated layout as an updated input to the patterning process is generated, wherein the updated layout is represented by a set of updated boundaries, and the updated boundaries pass through the control points with the updated locations. That is, the set of the moved control points generated at step S27 is used to update the set of the original control points 34.

An iteration of the method for compensating the effect of the patterning process will be stopped while the layout as the input to the patterning process should not be corrected. While the layout as the input to the patterning process should be corrected again, steps S21-S28 of the iteration in FIG. 2 will be executed again. Since the set of the control points is updated at step S28, at repeated step S21, the provided set of the control points is the set of the control points with the updated locations.

It is noted that the kind of the layout mentioned above is not used to limit the present disclosure, and the kind of patterning process effect is not used to limit the present disclosure, either. The patterning process effect may represent the output signal of the patterning process, and that is, the comparison values are SE values being represented of the patterning process effect. The patterning process effect may also represent the output contour of the patterning process, and that is, the comparison values are the EPE values being represented of the patterning process effect. The patterning process mentioned above may be the lithography process or the etching process, but the present disclosure is not limited thereto. Moreover, the regions that enclosed by the boundaries of the layout 31 as the input to the patterning process may be the polygon regions with Manhattan geometry (i.e. the geometry merely with vertical and horizontal lines).

Figure 4:
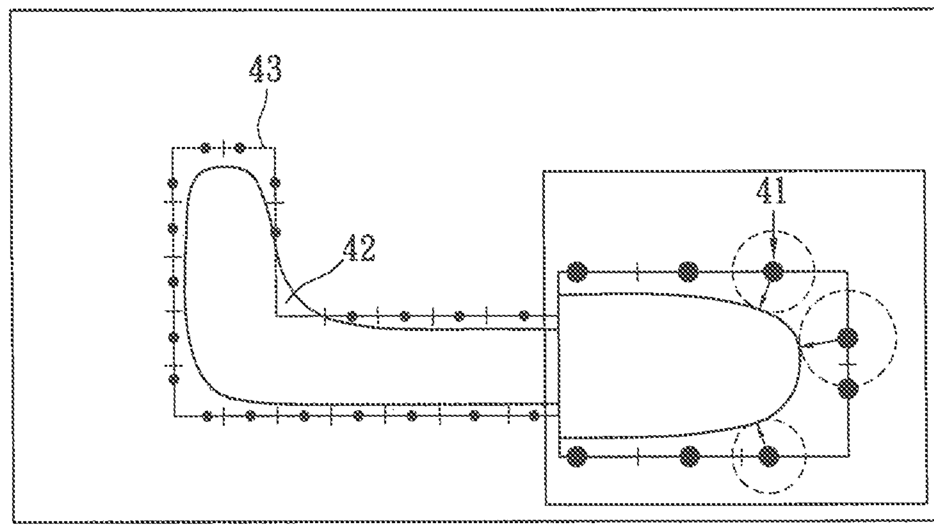
FIG. 4 is schematic diagram showing the EPE value at the evaluation point according to an exemplary embodiment of the present disclosure.

Referring to FIG. 4, FIG. 4 is schematic diagram showing the EPE value at the evaluation point according to an exemplary embodiment of the present disclosure. The EPE value mentioned above is illustrated herein. In FIG. 4, the EPE is generally the shortest distance from the evaluation point 41 of the drawn layout 43 to the actual layout 42. The amount of the EPE determines the direction and the shifted amount of the control point.

Figure 5:
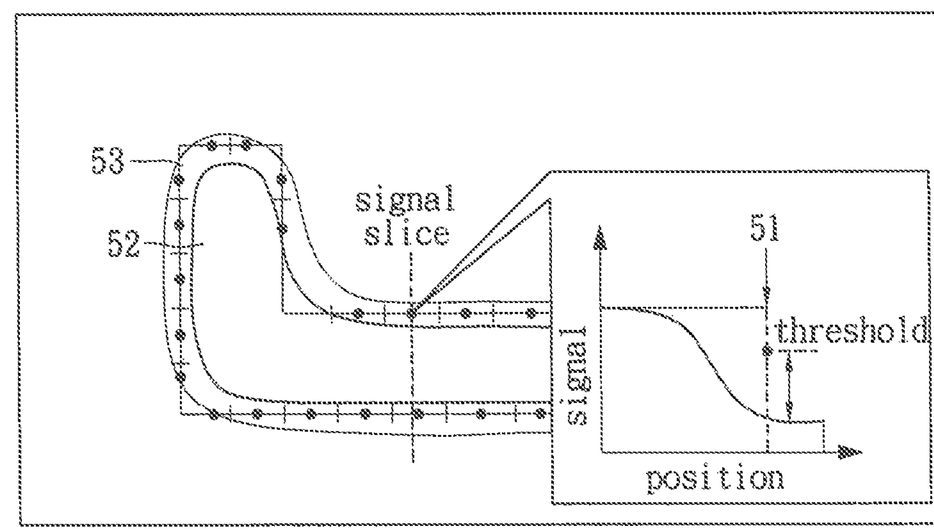
FIG. 5 is schematic diagram showing the signal error (SE) value at the evaluation point according to an exemplary embodiment of the present disclosure.

Referring to FIG. 5, FIG. 5 is schematic diagram showing the SE value at the evaluation point according to an exemplary embodiment of the present disclosure. The SE value mentioned above is illustrated herein. In FIG. 5, the SE value is measured at the evaluation point 51 on the signal slice, and is generally the differential value between the actual signal value corresponding to the actual layout 52 and the signal threshold value corresponding to the drawn layout 53.

Herein the details for computing the directions and amounts of the moved control points are illustrated, but the present disclosure is not limited thereto. While the comparison values are the SE values, the directions and amounts of the control points at the $j^{th}$ iteration may be presented by the vector $u_j=u_{j-1}+K_p e_j+K_i\Sigma_{n=1}^{j}e_n+K_d(e_j-e_{j-1})$, wherein j is an iteration index, $e_j$ denotes the vector of the SE values at the $j^{th}$ iteration, $K_p$ is the proportional parameter, $K_i$ is the integral parameter, and $K_d$ the a derivative parameter.

Figure 6:
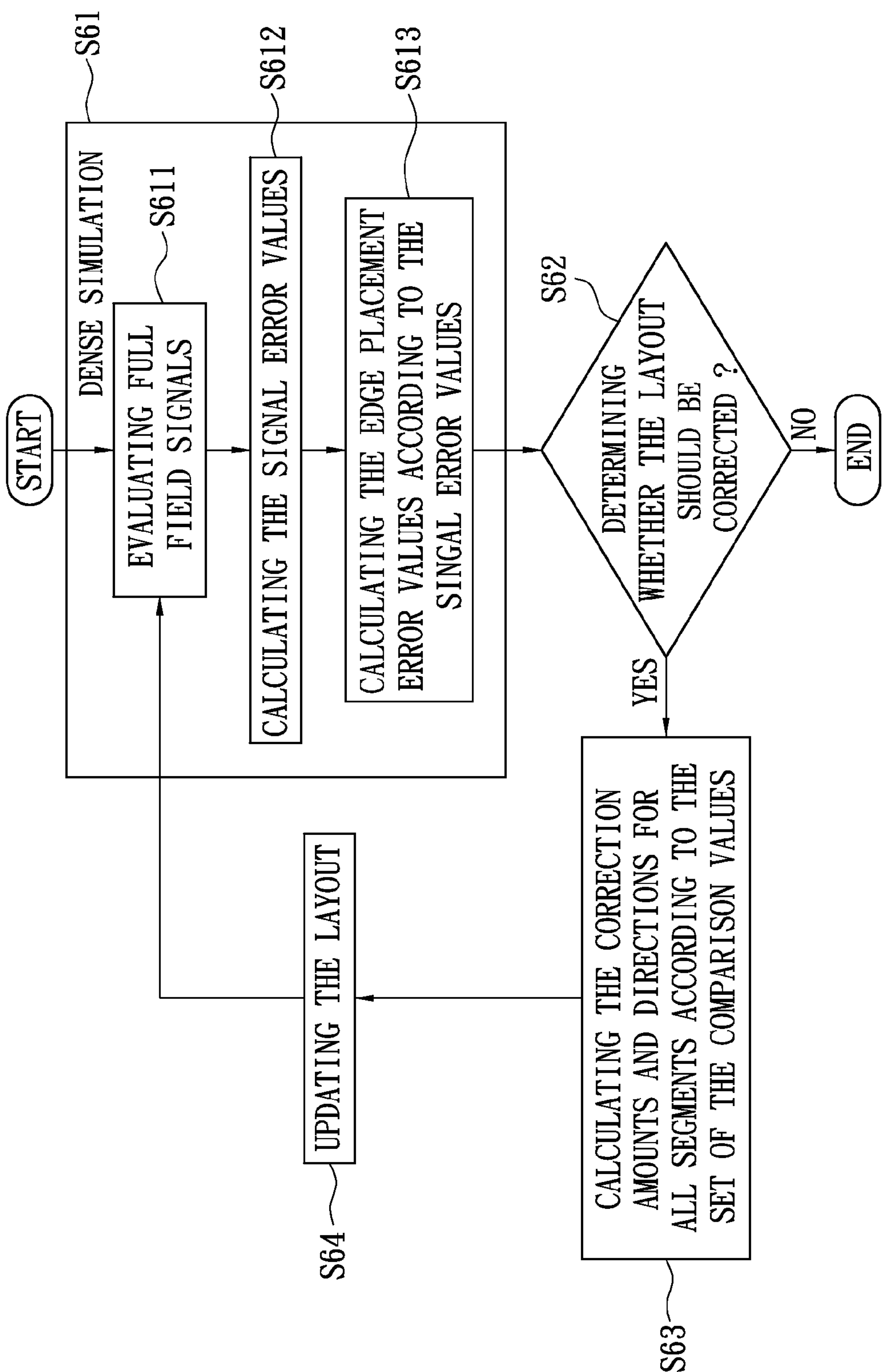
FIG. 6 is a flow chart showing a method for compensating an effect of a patterning process according to an exemplary embodiment of the present disclosure.

Referring to FIG. 6, FIG. 6 is a flow chart showing a method for compensating the effect of the patterning process according to an exemplary embodiment of the present disclosure. The steps S21-S28 of the iteration in FIG. 2 are executed in the FIG. 6 while the layout as the input to the patterning process should be corrected (i.e. the set of the control points should be moved).

At step S61, a dense simulation for the patterning process using a layout as an input to the patterning process is simulated, so as to obtain the EPE values. In this exemplary embodiment, the comparison values are EPE values at the evaluation points, but the present disclosure is not limited thereto.

Step S61 comprises steps S611-S612. At step S611 the full field signals are evaluated. Steps S21-S25 in FIG. 2 can executed at steps S611, such that the set of the actual signal values (the actual measurement values) at the set of the evaluation points are provided, and the set of the signal threshold values (the target measurement values) at the set of the evaluation points are provided.

At step S612, the SE values are calculated, and then at step S613, the EPE values are calculated according to the SE values. Step S26 can be executed at step S612 and S613, such that the set of the EPE values (comparison values) at the set of the evaluation points is computed according to the set of the actual signal values (the actual measurement values) and the set of the signal threshold values (the target measurement values).

At step S62, whether the layout should be corrected is determined. If the layout should be corrected, the step S23 will be executed; otherwise, the method for compensating the effect of the patterning process is ended. Step S62 is used to halt the iteration of the method for compensating the effect of the patterning process, and the condition to halt the iteration is mentioned above, therefore omitting the repeated description.

At step S63, the correction directions and amounts for all segments (i.e. all control points) are calculated according to the set of the comparison values, so as to move the set of control points. Step S27 in FIG. 2 is executed at step S63, wherein the set of the control points is therefore moved to the set of the updated locations.

At step S64 the layout is updated. The set of the moved control points generated at step S63 (i.e., the set of the control points with the updated locations) is used to update the layout. Step S28 in FIG. 2 is executed at step S64, wherein the updated layout is generated as the updated input to the patterning process.

Figures 7, 8:
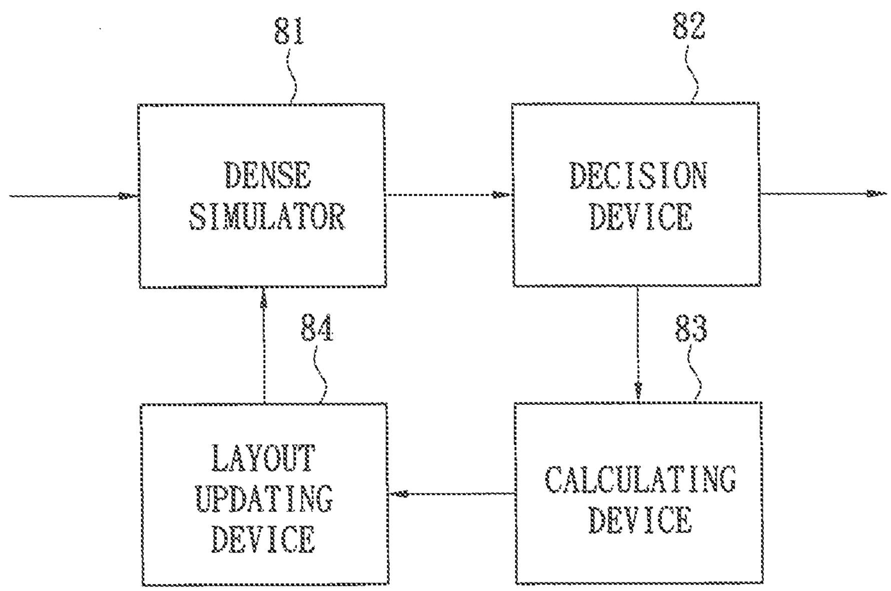
FIG. 7 is a table showing the run times and memory usages of the method for compensating the effect of the patterning process and the DCOPC method according to an exemplary embodiment of the present disclosure.
FIG. 8 is a block diagram showing an apparatus for compensating an effect of a patterning process according to an exemplary embodiment of the present disclosure.

Referring to FIG. 7, FIG. 7 is a table showing the iteration numbers, the run times, and memory usages of the method for compensating the effect of the patterning process and the DCOPC method according to an exemplary embodiment of the present disclosure. In the presence the 3-D mask effects, the layouts on a poly layer, an active layer, and a contact layer should be corrected.

The method (i.e. non-DCOPC method) for compensating the effect of the patterning process costs 10 iterations, 7 iterations, and 6 iterations to respectively correct the layouts on the poly layer, the active layer, and the contact layer, but the DCOPC method costs 13 iterations, 9 iterations, and 6 iterations to respectively correct the layouts on the poly layer, the active layer, and the contact layer. The method for compensating the effect of the patterning process costs 48 seconds, 35 seconds, and 28 seconds to respectively correct the layouts on the poly layer, the active layer, and the contact layer, but the DCOPC method costs 64 seconds, 45 seconds, and 30 seconds to respectively correct the layouts on the poly layer, the active layer, and the contact layer. The method for compensating the effect of the patterning process costs 2.151 GBs (Giga-Bytes) memory usage, 2.127 GBs memory usage, and 2.112 GBs memory usage to respectively correct the layouts on the poly layer, the active layer, and the contact layer, and the DCOPC method costs 2.151 GBs memory usage, 2.127 GBs memory usage, and 2.112 GBs memory usage to respectively correct the layouts on the poly layer, the active layer, and the contact layer.

In the presence the 3-D mask effects, the method for compensating the effect of the patterning process can have significant advantages over the DCOPC method in terms of the correction accuracy and the run time saving. In the absence of the 3-D mask effects, a significant run time saving can be achieved while the correction accuracies of the method for compensating the effect of the patterning process and DCOPC method are similar.

Referring to FIG. 8, FIG. 8 is a block diagram showing an apparatus for compensating an effect of a patterning process according to an exemplary embodiment of the present disclosure. The apparatus 8 for compensating the effect of the patterning process comprises a dense simulator 81, a decision device 82, a calculating device 83, and a layout updating device 84. The dense simulator 81 is electrically connected to the decision device 82, and the decision device 82 is electrically connected to the calculating device 83. The calculating device 83 is electrically connected to the layout updating device 84, and the layout updating device 84 is electrically connected to the dense simulator 81.

The dense simulator 81 can select the layout initially designed or the layout updated by the layout updating device 84 as the input to the patterning process. In the first iteration, the dense simulator 81 selects the layout initially designed as the input to the patterning process, and in the other iterations, the dense simulator 81 selects the layout updated by the layout updating device 85. The layout as the input to the patterning process is represented by a set of boundaries, and the set of the boundaries passes through a set of the control points and encloses a set of regions with a plurality of constant values for the patterning process. In other words, the layout as the input to the patterning process is defined by the set of the control points, and the dense simulator 81 substantially obtains the set of the control points initially designed or updated by the layout updating device 84.

The dense simulator 81 run a dense simulation with the layout as the input to the patterning process, so as to obtain a set of target measurement values of the effect of the patterning process at the set of the evaluation points and a set of actual measurement values of the effect of the patterning process with the layout at the set the evaluation points. Next, the dense simulator 81 computes a set of comparison values according to the target measurement values and the actual measurement values at the set of the evaluation points.

The decision device 82 decides whether the layout as the input to the patterning process should be corrected according to an iteration number and a target iteration number, or according to the set of the comparison values and a set of target comparison values at the set of the evaluation points. If the layout should be corrected, the decision device 82 outputs the comparison values to the calculating device 83. If the layout should not be corrected, the decision device 82 outputs the comparison values to the designer.

The calculating device 83 computes the correction amounts and directions of the control points according to the set of the comparison values, and moves the control points to a set of updated locations with the directions and the amounts. The layout updating device 84 generates an updated layout as an updated input to the patterning process.

Accordingly, the exemplary embodiments provide a method and apparatus for compensating an effect of a patterning process. Compared with the DCOPC method, the run time of the method for compensating the effect of the patterning process is reduced, the memory usage of the method for compensating the effect of the patterning process not increased, and the correction accuracy of the method for compensating the effect of the patterning process is not reduced.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A method for compensating an effect of a patterning process, wherein the patterning process represents a lithography process or an etching process, and an iteration thereof comprises:

providing a set of control points;

defining a layout as an input to the patterning process, wherein the layout is represented by a set of boundaries, and the boundaries pass through the control points and enclose a set of regions with a plurality of constant values for the patterning process;

providing a set of evaluation points;

providing a set of target measurement values of the effect of the patterning process at the set of evaluation points;

providing a set of actual measurement values of the effect of the patterning process with the layout at the set of evaluation points;

computing a set of comparison values according to the target measurement values and the actual measurement values at the set of the evaluation points;

moving the set of the control points to a set of updated locations with a plurality of directions and a plurality of amounts according to the set of the comparison values; and generating an updated layout as an updated input to the patterning process, wherein the updated layout is represented by a set of updated boundaries, and the updated boundaries pass through the set of control points with the set of updated locations.

2. The method for compensating the effect of the patterning process according to claim 1, wherein the effect of the patterning process represents an output signal of the patterning process.

3. The method for compensating the effect of the patterning process according to claim 2, wherein the set of comparison values is a set of signal error values at the set of the evaluation points.

4. The method for compensating the effect of the patterning process according to claim 3, wherein the comparison values are the signal error values, the directions and amounts at the $j^{th}$ iteration are presented by a vector $u_j = u_{j-1} + K_p e_j + K_i \Sigma_{n=1}^{j} e_n + K_d(e_j - e_{j-1})$, wherein j is an iteration index, $e_j$ denotes a vector of the signal error values at the $j^{th}$ iteration, $K_p$ is a proportional parameter, $K_i$ is an integral parameter, and $K_d$ is a derivative parameter.

5. The method for compensating the effect of the patterning process according to claim 1, wherein the effect of the patterning process represents an output contour of the patterning process.

6. The method for compensating the effect of the patterning process according to claim 5, wherein the set of comparison values is a set of edge placement error values at the set of the evaluation points.

7. The method for compensating the effect of the patterning process according to claim 1, wherein the boundaries encloses polygon regions with Manhattan geometry.

8. The method for compensating the effect of the patterning process according to claim 1, further comprising:

halting the iteration according to the set the comparison values and a set of target comparison values at the set of the evaluation points, or according to an iteration number and a target iteration number.

9. The method for compensating the effect of the patterning process according to claim 8, wherein the iteration is halted when the iteration number exceeds the target iteration number, or when the set of the comparison values fall within the set of the target comparison values.

10. The method for compensating the effect of the patterning process according to claim 1, wherein the method for compensating the effect of the patterning process is applied to particle beam lithography.

11. An apparatus for compensating an effect of a patterning process, wherein the patterning process represents a lithography process or an etching process, comprising:

a dense simulator, selectively receiving a layout initially designed or updated by a layout updating device, running a dense simulation with the layout as an input to the patterning process to obtain a set of target measurement values of the effect of the patterning process at a set of evaluation points and a set of actual measurement values of the effect of the patterning process with the layout at the evaluation points, and computing a set of comparison values at the set of the evaluation points according to the set of the actual measurement values and the set of the target measurement values, wherein the layout is represented by a set of boundaries, and the set of boundaries pass through a set of control points and enclose a set of regions with a plurality of constant values for the patterning process;

a calculating device, calculating a plurality of directions and a plurality of amounts according to the set of the comparison values, and moving the set of the control points to a set of updated locations with the directions and the amounts according to the set of the comparison values; and the layout updating device, generating an updated layout as an updated input to the patterning process, wherein the updated layout is represented by a set of updated boundaries, and the set of updated boundaries pass through the set of control points with the set of updated locations.

12. The apparatus for compensating the effect of the patterning process according to claim 11, wherein the effect of the patterning process represents an output signal of the patterning process.

13. The apparatus for compensating the effect of the patterning process according to claim 12, wherein the set of comparison values is a set of signal error values at the set of the evaluation points.

14. The apparatus for compensating the effect of the patterning process according to claim 13, wherein the comparison values are the signal error values, the directions and amounts at the $j^{th}$ iteration are presented by a vector $u_j=u_{j-1}+K_p e_j+K_i\Sigma_{n=1}^{j}e_n+K_d(e_j-e_{j-1})$, wherein j is an iteration index, $e_j$ denotes a vector of the signal error values at the $j^{th}$ iteration, $K_p$ is a proportional parameter, $K_i$ is an integral parameter, and $K_d$ is a derivative parameter.

15. The apparatus for compensating the effect of the patterning process according to claim 11, wherein the effect of the patterning process represents an output contour of the patterning process.

16. The apparatus for compensating the effect of the patterning process according to claim 15, wherein the set of comparison values is a set of edge placement error values at the set of the evaluation points.

17. The apparatus for compensating the effect of the patterning process according to claim 11, wherein the set of updated boundaries encloses polygon regions with Manhattan geometry.

18. The apparatus for compensating the effect of the patterning process according to claim 11, further comprising:

a decision device, determining whether the layout is corrected according to the set of comparison values and a set of target comparison values at the set of the evaluation points, or according to an iteration number and a target iteration number, wherein if the layout is not corrected, the decision device outputs the layout.

19. The apparatus for compensating the effect of the patterning process according to claim 18, wherein the layout is not corrected when the iteration number exceeds the target iteration number, or when the set of the comparison values fall within the set of the target comparison values.

20. The apparatus for compensating the effect of the patterning process according to claim 11, wherein the apparatus for compensating the effect of the patterning process is applied to particle beam lithography.

* * * * *